United States Patent [19]

Hansen et al.

[11] Patent Number: 4,809,208
[45] Date of Patent: Feb. 28, 1989

[54] PROGRAMMABLE MULTISTAGE DIGITAL FILTER

[75] Inventors: Victor L. Hansen; Eric Etheridge, both of Beaverton, Oreg.

[73] Assignee: Tektronix, Inc., Beaverton, Oreg.

[21] Appl. No.: 34,470

[22] Filed: Apr. 3, 1987

[51] Int. Cl.[4] ............................................. G06F 15/31
[52] U.S. Cl. ................................................ 364/724.12
[58] Field of Search ........................... 364/724, 724.12

[56] References Cited

U.S. PATENT DOCUMENTS

| | | | |
|---|---|---|---|
| 3,703,632 | 11/1972 | Shanks | 364/724.12 |
| 3,872,290 | 3/1975 | Crooke et al. | 364/724 |
| 3,930,147 | 12/1975 | Bellanger et al. | 364/724 |
| 4,125,900 | 11/1978 | Betts | 364/724 |
| 4,146,931 | 3/1979 | Delforge | 364/724 |
| 4,561,065 | 12/1985 | Matsuda | 364/724 |
| 4,701,873 | 10/1987 | Schenk | 364/724 |

Primary Examiner—David H. Malzahn
Attorney, Agent, or Firm—John P. Dellett; Peter J. Meza

[57] ABSTRACT

A multistage digital filter for producing an output data sequence in response to elements of an input data sequence includes a multiplier for multiplying elements of the input data sequence by selected coefficients to produce product terms. An accumulator sums product terms to produce elements of a first filter stage output sequence and elements of the first filter stage output sequence are sequentially fed back to the multiplier. The multiplier and accumulator produce accumulated sums in response to the first stage output sequence to provide a second filter stage output sequence. In a similar fashion, each filter stage output sequence is fed back to the multiplier as the input sequence to the next filter stage until the output sequence of the last filter stage is produced.

2 Claims, 2 Drawing Sheets

PROGRAMMABLE MULTISTAGE DIGITAL FILTER

BACKGROUND OF THE INVENTION

The present invention relates in general to digital filters and in particular to a programmable, multiple stage digital filter.

A digital filter typically produces an output data sequence wherein each element thereof is a function of one or more elements of an input data sequence. A variety of digital filter types are known. A low pass digital filter removes high frequency oscillations in the magnitude of elements of the input data sequence. A "decimation" filter produces an output data sequence having fewer elements than its input data sequence, while an "interpolation" filter produces an output data sequence having more elements than its input data sequence. Decimation filters are useful when an input data sequence has more elements than needed to convey information concerning some time varying phenomena. In such application, a decimation filter can reduce the number of elements in the sequence so that data can be more rapidly processed or more compactly stored. Interpolation filters are used, for example, to increase the number of elements in a data sequence to be converted into an analog signal because the additional sequence elements can help smooth the resulting analog signal.

Digital filters are often cascaded to produce a desired effect. For example, a low pass digital filter may be efficiently implemented by a cascade of decimation filters followed by a cascade of interpolation filters. (See L. R. Rabiner, "A Novel Implementation for Narrow Band FIR Digital Filters", IEEE Transactions on Acoustics, Speech, and Signal Processing, Vol. ASSP-23, No. 5, October, 1975.)

A digital computer could carry out the computational operations of a single digital filter, or a cascade of digital filters, but in high speed applications a digital computer is often too slow to provide suitably rapid response. Thus, digital filters are typically implemented utilizing discrete hardware components designed to quickly perform specific computational operations. While cascades of hardware implemented digital filters have fast response, they are usually expensive to manufacture and must be custom designed for each application.

SUMMARY OF THE INVENTION

In accordance with one aspect of the present invention, each stage of a multistage programmable digital filter circuit is a finite-duration impulse-response (FIR) filter producing an output data sequence w in response to an input data sequence v, the stages being cascaded so that the output sequence of each stage except the last stage provides the input data sequence for a next stage. For each filter stage, the transfer function relating data sequence elements w(i) of its output data sequence w to elements v(i) of its input data sequence v is independently programmable and comprises a sum of terms, each term comprising the product of a selected input sequence element and a selected coefficient. For example, the transfer function for a stage may be of the form:

$$w(i) = \sum_{n=0}^{N-1} h(n) * v(i-n) \quad [1]$$

wherein each coefficient h(n) may be selected according to the desired transfer function of the filter.

The filter circuit of the present invention includes a multiplier for producing product terms such as h(n)*v(i−n) for each element of the output sequence w of each filter stage, and an accumulator for accumulating (summing) product terms produced by the multiplier. The accumulator suitably comprises an adder for adding accumulated sums to terms produced by the multiplier, and a random access memory (RAM) wherein the sums are accumulated. The adder adds products produced by the multiplier to the appropriate accumulated sum stored in the RAM and replaces the accumulated sum with the result of the addition.

The multiplier and accumulator perform data processing for successive stages on a time sharing basis. When the adder adds the last term to an accumulated sum, the sum represents the value of the next element of the output sequence of a particular filter stage. When the stage is the last stage in cascade, the sum comprises the next element of the output sequence of the cascade. When the stage is not the last stage, the sum is stored and subsequently fed back to the multiplier as the next element of an input data sequence for the next successive filter stage in cascade. Since the same multiplier and accumulator are utilized to implement multiple cascaded filter stages, the amount of hardware needed to implement multiple filter stages is substantially reduced over what is typically needed when successive filter stages are separately implemented.

According to another aspect of the invention, the values of coefficients h(n) and the order in which product terms are accumulated may be independently controlled for each filter stage. Thus the transfer function of each filter stage is independently programmable and may differ from stage to stage.

According to still another aspect of the invention, the accumulator further includes a second adder, also having the multiplier output as an input, and an accumulator RAM having two data ports which allow independent, simultaneous read and write access to separate addresses in the RAM by the two adders. Thus the first and second adders may simultaneously add an output term produced by the multiplier to separate sums stored in the two-port RAM and replace the sums with their outputs. Since linear phase FIR filters are "symmetric", coefficient h(n) is equal to coefficient h(N−1−n) and the second adder substantially increases the rate at which a linear phase filter stage can operate.

It is accordingly an object of the present invention to provide an improved multistage digital filter which may be implemented with a relatively small amount of hardware.

It is another object of the invention to provide an improved multistage digital filter wherein the transfer function of each stage is independently programmable.

It is another object of the invention to provide a relatively inexpensive circuit which can perform the function of cascaded high speed digital filters wherein the number of filter stages and the type of filter provided by each stage may be programmably determined.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
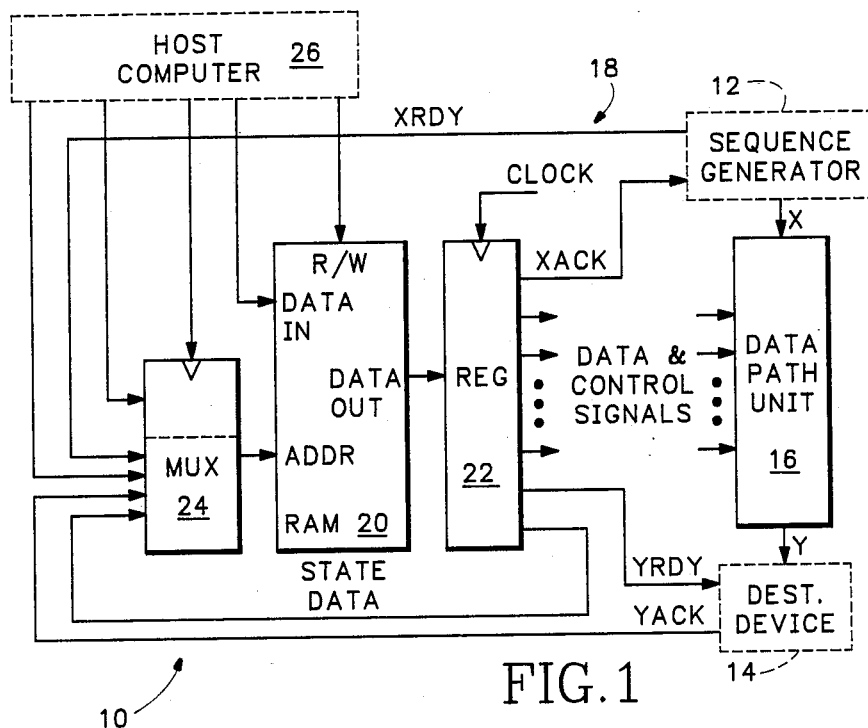
FIG. 1 is a block diagram of a multistage digital filter according to the present invention.

With reference to FIG. 1, depicting in block diagram form a multistage digital filter circuit 10 according to the present invention, filter circuit 10 is adapted to convert an input data sequence X produced by a sequence generator 12 into an output data sequence Y according to a programmably determined transfer function, and to pass the output data sequence to a destination device 14. Filter circuit 10 comprises a data path unit 16 adapted to calculate each element Y(i) of the output data sequence Y according to the values of one or more elements X(0) through X(i) of the input data sequence X. Filter circuit 10 also comprises a state machine 18 which controls the operation of data path unit 16 by transmitting sequences of data and control signals to data path unit 16 and which controls input/output handshaking between data path unit 16, sequence generator 12 and destination device 14.

The basic function of state machine 18, generation of predetermined patterns of data and control signals in response to patterns of data input, may be implemented in a variety of well-known ways. As shown in FIG. 1, state machine 18 suitably comprises a random access memory (RAM) 20 and a register 22 clocked by an externally generated clock signal. RAM 20 normally operates in a read mode, and addressed data stored in RAM 20 supplies input to register 22. The output of register 22 supplies data and control signals to data path unit 16, an acknowledge signal (XACK) to sequence generator 12, and a ready signal (YRDY) to destination device 14. Register 22 also stores and feeds back state data to addressing terminals of RAM 20 via a multiplexer 24. A data ready signal (XRDY) produced by sequence generator 12 and a data acknowledge signal produced by destination device 14 are connected to additional addressing inputs of RAM 20 via multiplexer 24.

In order to reprogram the operation of digital filter 10, data stored in RAM 20 may be altered by a host computer 26 which has access to data input terminals of RAM 20 and also to the address terminals of RAM 20 by way of multiplexer 24. Host computer 26 controls the switching state of multiplexer 24 and a read/write control terminal of RAM 20. Host computer 26 may reset state machine 10 to an initial state by means of a RESET signal supplied to the address terminals of RAM 20 via multiplexer 24, and may inhibit state changes in state machine 10 with a HALT signal, also supplied to address terminals of RAM 20 via multiplexer 24.

In the preferred embodiment, filter circuit 10 has from 1 to 8 digital filter stages. Each filter stage is a finite-duration impulse response filter producing an output data sequence w in response to an input data sequence v, and the stages are cascaded so that the output sequence w produced by one stage becomes the input sequence v to the next stage. Each stage may have a different transfer function whereby the "ith" output sequence element w(i) is a sum of terms, each term comprising the product of a selected input sequence element v(0) through v(i) and a selected coefficient h(n). For example, the transfer function for a direct FIR filter stage may be of the form:

$$w(i) = \sum_{n=0}^{N-1} h(n) * v(i - n) \quad [2]$$

As can be ascertained from equation [2], one output sequence element w(i) is produced for each input sequence element v(i) and element w(N) of the w sequence, and each subsequent element w(i), comprises the sum of N product terms (i.e., the filter stage is of "length" N). Transfer functions of forms other than shown in equation [2] are also possible, as discussed hereinbelow.

For a stage of length N=3, having a transfer function according to equation [2], it can be seen from equation [2] that the first five elements w(i) of the output sequence w are as shown in Table I below:

w(0)=h(0)*v(0)

w(1)=h(1)*v(0)+h(0)*v(1)

w(2)=h(2)*v(0)+h(1)*v(1)+h(0)*v(2)

w(3)=h(2)*v(1)+h(1)*v(2)+h(0)*v(3)

w(4)=h(2)*v(2)+h(1)*v(3)+h(0)*v(4)

TABLE I

Table I illustrates that each element v(i) of the input sequence v forms three products, h(0)*v(i), h(1)*v(i), and h(2)*v(i), and that each successive product is included as a term in a sum associated with a separate, successive element w(i) of the output sequence y.

Figure 2:
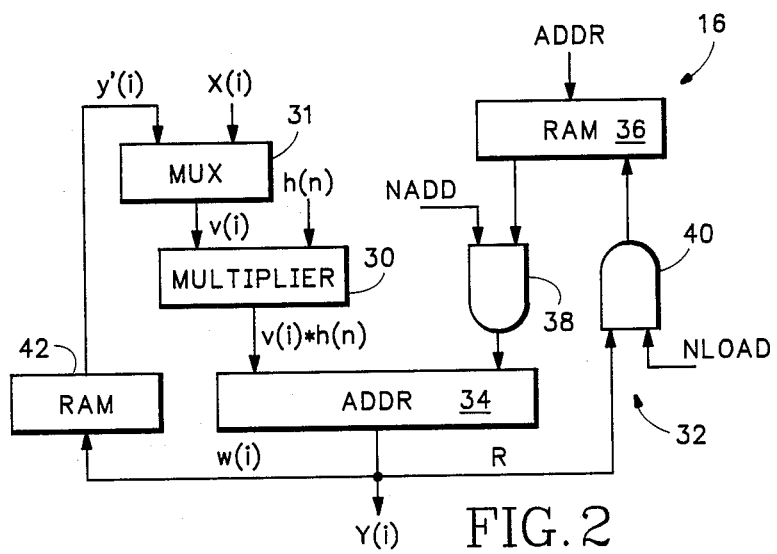
FIG. 2 is a simplified block diagram of the data path unit of the multistage digital filter of FIG. 1.

Referring to FIG. 2, depicting data path unit 16 of FIG. 1 in simplified block diagram form, data path unit 16 includes a multiplier 30 for producing each term h(n)*v(i−n) for each element of the output sequence w of each filter stage, and an accumulator 32 for accumulating (summing) terms produced by the multiplier to produce output sequence elements w(i). Thus, to produce the direct FIR filter output sequence illustrated in Table I, data path unit 16 multiplies each incoming sequence element v(i) by three coefficients h(0), h(1), and h(2) and adds each resulting product to a separate accumulated partial sum R(i), R(i+1) and R(i+2), each sum being associated with a separate output sequence element w(i), w(i+1) and w(i+2). When all terms associated with a particular output sequence element w(i) for a particular stage have been accumulated, the resulting accumulated value is provided as the next filter stage output element w(i).

For each stage, the next input sequence element to be multiplied by multiplier 30 is selected a multiplexer 31. If multiplier 30 is to generate a term for the first stage of a filter cascade, then multiplexer 31 selects X(i), the current element of the input sequence for the cascade. If multiplier 30 is to generate a term for a filter stage other than the first stage of the cascade, then multiplexer 31 selects w'(i), the last output sequence element produced by the preceding filter stage. The appropriate coefficient h(n) input to multiplier 30 is supplied by state machine 18 of FIG. 1.

Accumulator 32 includes an adder 34 and a random access memory (RAM) 36. Adder 34 is adapted to add each output term produced by multiplier 30 to an accumulated sum R stored in RAM 36. The sum produced by adder 34 may then be stored in RAM 36, thereby replacing the accumulated sum R with the result of the addition. Addressing of RAM 36 is controlled by an address signal (ADDR) produced by state machine 18 of FIG. 1. Data output terminals of RAM 36 are coupled to an input of adder 34 through a set of AND gates 38, each having another input controlled by a signal NADD produced by state machine 18 of FIG. 1. When NADD is low, a 0 value, rather than the currently addressed data in RAM 36, is passed to adder 34. The NADD signal may be driven low when the output of multiplier 30 is the first term of a sum to be accumulated in RAM 36 so that adder 34 merely adds a 0 to that term and forwards it for storage in RAM 36. The output of adder 34 is coupled to data input terminals of RAM 36 through another set of AND gates 40. A signal NLOAD produced by state machine 18 is applied to an additional input of each AND gate 40 and is driven low when RAM 36 is to store a 0 value rather than the output of adder 34. The NLOAD signal allows the contents of any storage location in RAM 36 to be initialized to 0 when necessary.

In implementing a direct full band FIR filter stage having a transfer function according to equation [2], a total of $N-1$ storage locations for the stage are reserved in RAM 36 to allow for accumulation of $N-1$ terms. For example when N is 3, two storage locations in RAM 36 are provided to store partially accumulated sums R(i) and R(i+1) for the next two terms, w(i) and w(i+1) of the output sequence. When v(i) is initially applied to one input of multiplier 30, the state machine 18 supplies coefficient h(0) to the other input of multiplier 30, and the multiplier produces the term h(0)*v(i). Adder 34 then sums this term with the partially accumulated sum R(i) for w(i) stored in RAM 36 and produces the result as the next element w(i) of the filter stage. The value of w(i) is not stored in RAM 36. Instead, the NLOAD signal applied to AND gate 40 is driven low, and the accumulated sum R(i) in the RAM 36 storage location holding associated with w(i) is initialized to 0 and subsequently utilized for accumulating the partial sum $R(i+N-1)$ associated with output sequence element $w(i+N-1)$.

State machine 18 next supplies coefficient h(1) to multiplier 30 so that the multiplier produces the term h(1)*v(i). Adder 34 adds this term to the accumulated sum for element w(i+1) stored in RAM 36. The resulting partial sum R(i+1), which does not yet include all of the terms comprising element w(i+1), is then stored in RAM 36 to update the last accumulated value of R(i+1).

Next, state machine 18 supplies coefficient h(2) to the multiplier 30 which produces one more term h(2)*v(i), the first term of stage output sequence element w(i+2). The NADD signal applied to AND gates 38 is driven low so that adder 34 sums this term with 0. The resulting output of adder 34 is then stored as partial sum R(i+2) at the RAM 36 address which previously contained the accumulated partial sum R(i) for the current stage output element w(i). At this point, multiplexer 31 may supply a new input sequence element v(i+1) as input to multiplier 30, and the process of multiplying three coefficients h(0), h(1) and h(2) by the input sequence element and accumulating three product terms is repeated.

Thus, each time an input sequence element v(i) of a particular stage is selected by multiplexer 31, a total of N product terms are produced by multiplier 30, one of such terms being added to an accumulated partial sum R(i) to produce an output sequence element w(i) and the remaining $N-1$ terms being accumulated into partial sums R(i+1) through $R(i+N-1)$ associated with output sequence elements w(i+1) through $w(i+N-1)$, the partial sums being stored in RAM 36.

When adder 34 adds the last term to an accumulated sum R(i) to produce the resulting output sequence element w(i) of a particular stage, and when the stage happens to be the last stage of the cascaded filter, w(i) is transmitted out of data path unit 16 as the next element Y(i) of the output sequence Y. However, when the current w(i) output of adder 34 is an element of an output sequence w of a stage other than the last stage, w(i) is stored in another RAM 42. RAM 42 includes one storage location for holding the most recently generated output sequence element w(i) for each intermediate stage, other than the last stage.

Inasmuch as the filter stages are cascaded, the output element w(i) of one stage becomes the input element of the next stage. Accordingly, the output element w(i) stored in RAM 42 for each intermediate stage may be provided as the next element w'(i) of the w' sequence input to multiplexer 31, and multiplexer 31 may select that element as the next element v(i) of the stage and supply it to multiplier 30.

Thus the "feedback" path between the output of adder 34 and the input to multiplier 30 provided by RAM 42 and multiplexer 31 allows data path unit 16 to carry out the functions of several filter stages on a "time sharing" basis. For example, multiplier 30 and accumulator 32 may process an input sequence element for a first stage by selecting an element v(i) of sequence v as the input to multiplier 30, and then process an input sequence element for a second stage by selecting an element w'(i) of sequence w' as input to multiplier 30, followed by processing a next input sequence element v(i+1) for the first stage by supplying that element to multiplier 30.

State machine 18 controls data flow through data processing unit 16 such that the data processing unit gives priority to stage calculations in reverse order, the last stage having highest priority and the first stage having lowest priority. Therefore, when an input sequence element for the last cascaded stage is available in RAM 42, that element is provided as the next input to multiplier 30. Conversely, a data processing unit input sequence element X(i) is applied to the input of multiplier 30 only when RAM 42 is empty. Thus calculations for a latter stage always have priority over calculations for a preceding stage.

Figure 3:
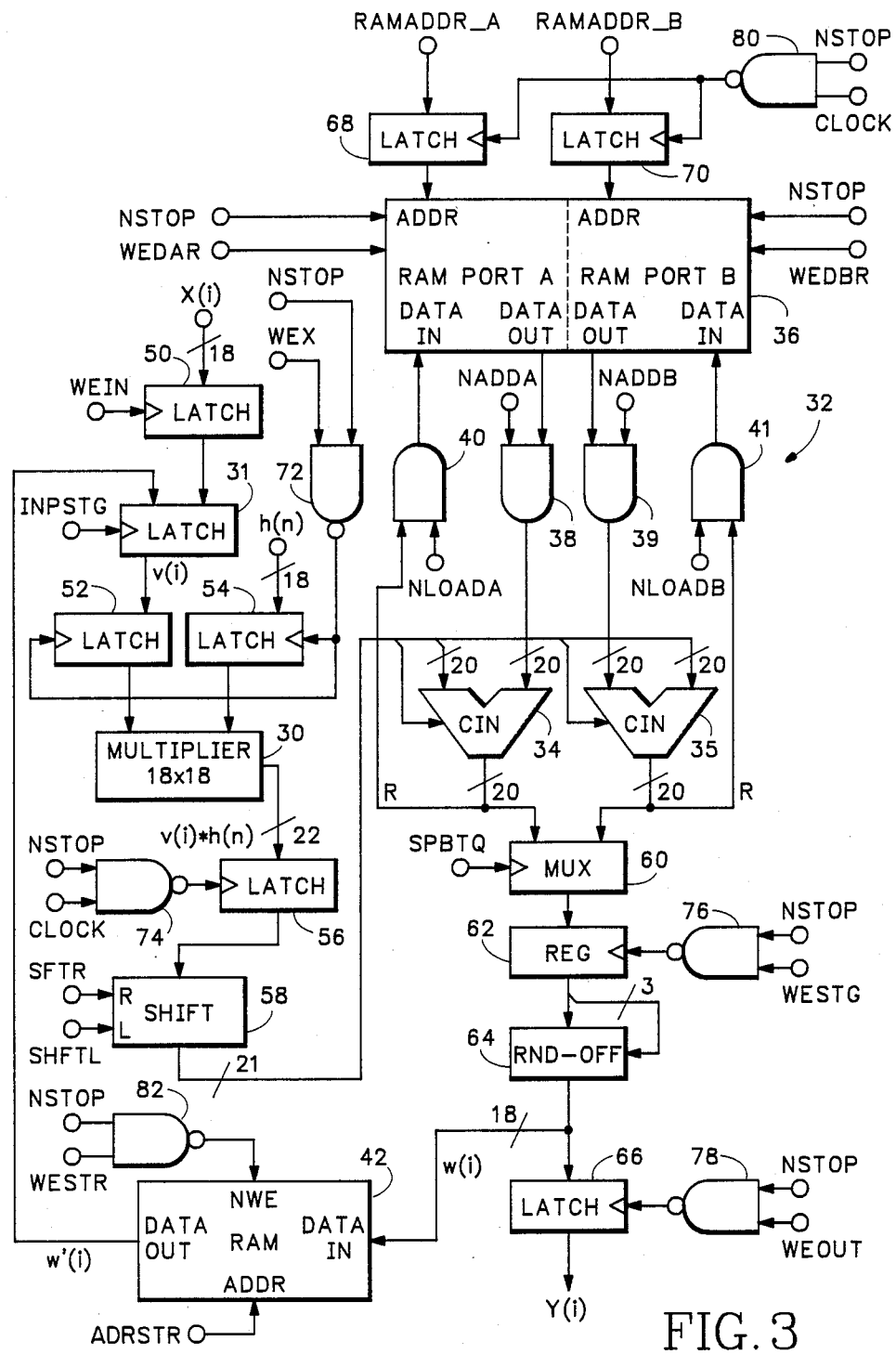
FIG. 3 is a more detailed block diagram of the data path unit of the multistage digital filter of FIG. 1.

A more detailed block diagram of data path unit 16, in FIG. 3, illustrates additional features of the unit. As discussed more fully hereinbelow, operating speed of data path unit 16 is improved by "pipelining" the data through through multiplexer 31, multiplier 30, adder 34, and RAM 42 utilizing latches and registers to clock data through each processing stage so that each stage can operate concurrently. A shift register 58 is provided to selectively increment or decrement output terms produced by multiplier 30 by a factor or two, or to pass the term unchanged, thereby permitting selective scaling of such terms. The speed with which accumulator 32 carries out accumulation operations for certain types of filter stages (as described in more detail below) is improved by providing RAM 36 as a dual port random access memory and by providing an additional adder 35 to assist adder 34 in performing accumulation operations. Provisions are also included for temporarily halting flow of data through the data path unit when necessary.

With further reference to FIG. 3, 18-bit data path unit input sequence elements X(i) are latched by a latch 50 onto the input of multiplexer 31, and the output of multiplexer 31 and 18-bit coefficients h(n) are latched onto inputs of multiplier 30 by latches 52 and 54, respectively. The 22-bit output of multiplier 30 is applied to the input of shift register 58 through a latch 56, and the 20 most significant bits of the 21-bit output of shift register 58 provide an input to adder 34 as well as to adder 35. A multiplexer 60 multiplexes the 20-bit outputs of adders 34 and 35 onto the input of a register 62, and the 18 most significant bits of the contents of register 62 are supplied as input to a round-off logic circuit 64. The 18-bit output of round-off logic circuit 64 is provided as input to a latch 66 and to data input terminals of RAM 42.

The output of ADDER 34 and a signal NLOADA are connected as inputs to a set of 20 AND gates 40, and the outputs of AND gates 40 are connected to data input terminals of port A of dual port RAM 36. Data output terminals of port A of RAM 36, along with a signal NADDA provide inputs to a set of 20 AND gates 38, the outputs of which drive an input of adder 34. Similarly, the output of ADDER 35 and a signal NLOADB are connected as inputs to a set of 20 AND gates 41 and the outputs of AND gates 41 are connected to the data input terminals of port B of dual port RAM 36. The data output terminals of port B, along with a signal NADDB control the inputs of a set of 20 AND gates 39, the outputs of which provide input to adder 35. When write enabled by the output of a NAND gate 80 driven by a system clock signal at its input, a pair of latches 68 and 70 latch addressing signals RAMADDRA and RAMADDRB produced by state machine 18 of FIG. 1 onto addressing terminals of ports A and B, respectively, of dual port RAM 36. Signals WEDAR and WEDBR, produced by state machine 18 control whether ports A and B, respectively, are read or write enabled.

In carrying out filter stage operations according to the direct FIR filter transfer function of equation [2], when state machine 18 of FIG. 1 receives an XRDY signal from sequence generator 12, indicating that an 18-bit element X(i) of input sequence X is available at the input of latch 50, state machine 18 may transmit an enabling signal WEIN to latch 50 causing latch 50 to forward X(i) to multiplexer 31. When state machine 18 subsequently determines that X(i) is to be processed, it transmits a signal INPSTG to multiplexer 31 causing the multiplexer to forward X(i) to latch 52. At the same time state machine 18 places an 18-bit coefficient h(0) on the input to latch 54. When state machine 18 determines that multiplier 30 has completed its last multiplication operation the state machine transmits an enable signal WEX to a NAND gate 72 causing the NAND gate output to enable latches 52 and 54, thereby passing X(i) and h(0) to inputs of multiplier 30. Multiplier 30 then computes h(0)*v(i) and passes it to latch 56. Latch 56, input enabled by a system clock signal acting through a NAND gate 74, passes the 22-bit output of multiplier 30 to shift register 58.

State machine 18 supplies a pair of control signal inputs SHFL and SHFR to shift register 58. When only SHFL is asserted, the shift register multiplies its input by 2 and passes the 21 most significant bits of the result to adders 34 and 35. When only SHFR is asserted, shift register 58 divides its input by two. If neither SHFL and SHFR are asserted, the shift register passes its input to adders 34 and 35 unchanged. Although shift register 58 produces a 21-bit output, only the most significant 20 bits are applied to inputs of adders 34 and 35. The remaining least significant bit is applied to a carry in (CIN) input of each adder to cause rounding off of the multiplier output.

The additional adder 35 is provided to carry out accumulations concurrently with adder 34 for filter stages which are implemented with "symmetric" coefficients h(n), such as linear phase FIR filter stages, in which for all h(n), h(n)=h(N−1−n). For example when N=7, h(0)=h(6), h(1)=h(5), and h(2)=h(4). When coefficients are symmetric, a term h(n)*v(i) produced by multiplier 30 has the same value as the term h(N−1n)*v(i). Therefore adder 35, which has independent access to dual port RAM 36, may carry out an accumulation for the h(N−1−n)*v(i) term using the value of h(n)*v(i) at the same time that adder 34 carries out the accumulation for the h(n)*v(i) term. This substantially doubles the rate at which data path unit 16 can process an input sequence element to a symmetric coefficient filter stage.

When adder 34 or 35 produces a fully accumulated sum R(i) associated with an output sequence element w(i), state machine 18 transmits a signal SPBTQ to multiplexer 60 to couple the output of the adder 34 or 35 to the input of register 62. State machine 18 subsequently transmits an enabling signal WESTG to a NAND gate 76, and the output of NAND gate 76 enables register 62. The 18 most significant bits stored in register 62 are passed to input terminals of round-off circuit 64 while the least significant bit (LSB2), the next least significant bit (LSB1), and the most significant bit (MSB) of the data stored in register 62 are applied to control terminals of circuit 64. Circuit 64 increments its 18 bit input data shown in the following truth table:

TABLE II

| Increment | MSB | LSB1 | LSB2 |
|---|---|---|---|
| NO | 0 | 0 | 0 |
| NO | 0 | 0 | 1 |
| YES | 0 | 1 | 0 |
| YES | 0 | 1 | 1 |
| NO | 1 | 0 | 0 |
| NO | 1 | 0 | 1 |
| NO | 1 | 1 | 0 |
| YES | 1 | 1 | 1 |

When the 18-bit output of round-off circuit 64 is an element Y(i) of the output sequence of the data path unit, state machine 18 transmits an enable signal WEOUT to an input of a NAND gate 78. The output of NAND gate 78 causes latch 66 to latch Y(i) onto output terminals of the data path unit. With reference to FIG. 1, state machine 18 then transmits the YRDY signal to destination device 14, and when device 14 accepts Y(i), it acknowledges reception by asserting the YACK signal.

If the output w(i) of round-off circuit 64 is an element in the output sequence of an intermediate filter stage other than the last cascaded stage, state machine 18 addresses RAM 42 with the address of a storage location associated with such intermediate stage utilizing an address signal ADRSTR. State machine 18 then transmits a WESTR signal to a NAND gate 82 the output of which write enables RAM 42 so that RAM 42 stores w(i). When state machine 18 subsequently determines that the stored w(i) value is to be next processed as an input signal to the next filter stage, according to the previously discussed order of priority, it transmits the appropriate address ADRSTR signal to RAM 42 such that the value of w(i) is stored therein.

NAND gates 72, 74, 76, 78, 80 and 82 each have a signal NSTOP produced by state machine 18 as an additional input, and when NSTOP is driven low, latches 52, 54, 56, 66, 68, and 70, register 62, and RAM 42 cannot be write enabled. An NSTOP signal is also applied to enabling inputs of ports A and B of RAM 36, and when NSTOP is asserted, the RAM cannot be addressed or accessed. Thus when NSTOP is asserted, the data processing operation of data path unit 16 is halted. State machine 18 drives NSTOP low when the data processing pipeline within data processing unit 16 is full and destination device 14 is currently unable to accept another output sequence element Y(i).

There has been described a multistage programmable digital filter circuit wherein each stage produces an output sequence w in response to an input sequence v according to equation [2] hereinabove. It should be understood, however, that the data path unit may implement digital filter stages having transfer functions other than that expressed in equation [2] inasmuch as the particular pattern of control signals that state machine 18 produces may be altered by altering data stored in RAM 20.

For example, a decimation filter is one in which the number of terms in its output sequence is fewer than the number of terms in its input sequence. The transfer function of one such decimation filter relating elements w(i) of its output data sequence to elements v(i) of its input data sequence is characterized by the equation:

$$w(i) = \sum_{n=0}^{N-1} h(n)*v(Mi + C - n) \quad [3]$$

where N is the length of the filter, h(n) is a selected coefficient, M is a decimation factor, and C is a sequence selection constant. For a stage of length N=3, with M=2 and C=0, having a transfer function according to equation [3], it can be seen from equation [3] that the first five elements w(i) of the output sequence w are as shown in Table III below:

w(0)=h(0)*v(0)

w(1)=h(0)*v(2)+h(1)*v(1)+h(2)*v(0)

w(2)=h(0)*v(4)+h(1)*v(3)+h(2)*v(2)

w(3)=h(0)*v(6)+h(1)*v(5)+h(2)*v(4)

w(4)=h(0)*v(8)+h(1)*v(7)+h(2)*v(6)

TABLE III

Referring to FIG. 3, when a filter stage has a transfer function according to equation [3], state machine 18 of FIG. 1, sets the INPSTG signal to apply v(0) to the input of latch 52, places h(0) on the input of latch 54, and then asserts the WEX signal, thereby latching h(0) and v(0) to the inputs of multiplier 30. The output of multiplier 30 is then latched by latch 56 and passed through shift register 58 to adder 34. With NADDA driven low, adder 34 adds h(0)*v(0) to 0 and the result is provided as output sequence element w(0). State machine 18 then applies h(2) to the input of latch 54 and asserts the WEX signal thereby latching h(2) and v(0) to the inputs of multiplier 30. The output of multiplier 30 is passed through latch 56 and shift register 58 to adder 34. With NADDA again driven low, adder 34 adds h(2)*v(0) to 0 and the resulting partial sum R(1) is stored in RAM 36.

When v(1) is next available at the input to multiplexer 31, state machine 18 of FIG. 1 sets the INPSTG signal to apply v(1) to the input of latch 52 and places h(1) on the input of latch 54, and then asserts the WEX signal thereby latching h(1) and v(1) to the inputs of multiplier 30. The output of multiplier 30 is passed through latch 56 and shift register 58 to adder 34. With NADDA driven high, adder 34 adds h(1)*v(1) to the accumulated sum R(1) to produce the result h(1)*v(1)+h(2)*v(0) which is stored in RAM 36 to update the last stored value of R(1).

When v(2) is available at the input to multiplexer 31, state machine 18 of FIG. 1 sets the INPSTG signal to apply v(2) to the input of latch 52, places h(0) on the input of latch 54, and asserts the WEX signal to latch coefficient h(0) and sequence element v(2) to the inputs of multiplier 30. The output of multiplier 30 is transmitted through latch 56 and shift register 58 to adder 34. With NADDA driven high, adder 34 adds h(0)*v(2) to the accumulated sum R(1) to produce the result h(2)*v(2)+h(1)*v(1)+h(2)*v(0) which is provided as stage output sequence element w(1) through multiplexer 60, register 62, and round-off circuit 64.

State machine 18 then places h(2) at the input to latch 54 and asserts the WEX signal in order to latch h(2) and v(2) to the inputs of multiplier 30. When the output of multiplier 30 is subsequently passed to adder 34, NADDA is driven low so that adder 34 adds h(2)*v(2) to 0. The resulting partial sum R(2) is stored in RAM 36.

Similar multiplication and accumulation procedures are performed for each subsequent element v(i) of the stage input sequence such that when i is an even integer, it is multiplied by h(0) and by h(2) to produce terms which are accumulated to form two successive partial sums R(i) and R(i+1), and such that when i is an odd integer, it is multiplied by h(1) to produce a term which is accumulated in only one partial sum R(i). Thus filter circuit 10 of the present invention may also include stages which act as decimation filters, each producing an output data sequence having fewer elements than its input data sequence, and wherein the transfer function relating output and input sequences is programmably determined.

The filter circuit 10 of the present invention may include stages which act as interpolation filters wherein the number of terms in its output sequence is greater than the number of terms in its input sequence. The transfer function of one such interpolation filter, which doubles the number of elements in an input sequence to produce an output sequence, is characterized by the equations:

$$w(2*i) = \sum_{n=0}^{Lim1} h(2*n)*v(i - n) \quad [4]$$

$$w(2*i + 1) = \sum_{n=0}^{Lim2} h(2*n + 1)*v(i - n) \quad [5]$$

where $Lim1=(N-1)/2$ and $Lim2=((N-1)/2)-1$ when N is odd, and where $Lim1=(N-2)/2$ and $Lim2=(N2)/2$ when N is even.

For a stage of length N=5, having a transfer function according to equations [4] and [5], it can be seen that the first eight terms w(i) of the output sequence w are as shown in Table IV below:

w(0)=h(0)*v(0)

w(1)=h(1)*v(0)

w(2)=h(0)*v(1)+h(2)*v(0)

w(3)=h(1)*v(1)+h(3)*v(0)

w(4)=h(0)*v(2)+h(2)*v(1)+h(4)*v(0)

w(5)=h(1)*v(2)+h(3)*v(1)

w(6)=h(0)*v(3)+h(2)*v(2)+h(4)*v(1)

w(7)=h(1)*v(4)+h(3)*v(2)

TABLE IV

Referring to FIG. 3, when a filter stage has a transfer function according to equations [4] and [5], state machine 18 of FIG. 1 sets the INPSTG signal to apply v(0) to the input of latch 52, places h(0) on the input of latch 54, and then asserts the WEX signal thereby latching h(0) and v(0) to the inputs of multiplier 30. The output of multiplier 30 is passed by latch 56 and shift register 58 to adder 34. With NADDA driven low, adder 34 adds h(0)*v(0) to 0 and the result is produced as output sequence element w(0). State machine 18 applies h(1) to the input of latch 54 and asserts the WEX signal so as to latch h(1) and v(0) to the inputs of multiplier 30. The output of multiplier 30 is passed to adder 34, and with NADDA again driven low, adder 34 adds h(1)*v(0) to 0. The result is passed by multiplexer 60 to register 62 to provide output sequence element w(1).

State machine 18 then applies h(2) to the input of latch 54 and asserts the WEX signal to latch h(2) and v(0) to the inputs of multiplier 30. The output of multiplier 30 is passed to adder 34. With NADDA still low, adder 34 adds h(2)*v(0) to 0 and the resulting partial sum R(2) is stored in RAM 36. State machine 18 next applies h(3) to the input of latch 54 and asserts the WEX signal to latch h(3) and v(0) to the inputs of multiplier 30. With NADDA still low, adder 34 subsequently adds the product h(3)*v(0) to 0 and the resulting partial sum R(3) is stored in RAM 36. Finally, state machine 18 applies h(4) to the input of latch 54 and asserts the WEX signal to latch h(4) and v(0) to the inputs of multiplier 30. With NADDA still low, adder 34 subsequently adds product h(4)*v(0) to 0 to produce partial sum R(4) which is all stored in RAM 36.

Thereafter, when input sequence element v(1) is available at an input to multiplexer 31, state machine 18 sets the INPSTG signal to apply v(1) to the input of latch 52. The state machine causes data multiplier 30 to sequentially produce terms h(0)*v(1), h(1)*v(1), h(2)*v(1), h(3)*v(1), h(4)*v(1), and causes accumulator 32 to accumulate these terms into sums R(2) through R(6) respectively, and in the process thereof, causes the accumulator to produce output sequence elements w(2) and w(3). Subsequent input sequence elements vi) are processed in a similar fashion such that two output sequence elements w(2*i) and w(2*i+1) are generated for each input sequence element.

Therefore it can be seen that the filter circuit 10 of the present invention may include stages which act as interpolation filters, each producing an output data sequence having more elements than its input data sequence, and wherein the transfer function relating output and input sequences is programmably determined.

There has thus been described a digital filter circuit adapted to implement cascaded digital filters, some of which may be decimation or interpolation filters, wherein each stage filters its input data sequence to produce an output data sequence according to a programmably determined transfer function, and wherein the transfer function of each stage may be independently determined.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A multistage digital filter for producing an output data sequence in response to elements of an input date sequence and to elements of a coefficient data sequence, said multistage digital filter comprising:

multiplier means for multiplying elements of a first data sequence by elements of said coefficient data sequence to produce product terms;

first memory means for storing accumulated sum, said first memory means having first and second ports for providing access to said accumulated sums;

first means for accessing through said first port a first accumulated sum stored in said first memory means, and for adding a product term produced by said multiplier to said first accumulated sum, thereby producing a fist output sum;

second means for accessing through said second port a second accumulated sum stored in said first memory means, and for adding a product term produced by said multiplier to said second accumulated sum, thereby producing a second output sum;

third means for selectively replacing said first accumulated output sum in said first memory means with said first output sum and to store said second output sum in place of said second accumulated sum, and for selectively producing elements of a second data sequence according to values of said first and second output sums; and fourth means for selecting between a first portion of the elements of said second data sequence and elements of said input data sequence to form said first data sequence, and for alternately generating said output data sequence including a second portion of the elements of said second data sequence.

2. The multistage digital filter according to claim 1 wherein said fourth means comprises:
  second memory means for storing elements of said second data sequence; and
  multiplexing means for selecting elements of said second data sequence stored in said second memory means and elements of said input data sequence as elements of said first data sequence.

* * * * *